United States Patent [19]
Chen et al.

[11] Patent Number: 5,620,915
[45] Date of Patent: Apr. 15, 1997

[54] METHOD FOR BYPASSING NULL-CODE SECTIONS FOR READ-ONLY MEMORY BY ACCESS LINE CONTROL

[75] Inventors: Hsin-Li Chen; Te-Sun Wu, both of Hsinchu, Taiwan

[73] Assignee: United Microelectronics Corporation, Hsinchu, Taiwan

[21] Appl. No.: 501,659

[22] Filed: Jul. 12, 1995

[51] Int. Cl.$^6$ .................................................. H01L 21/265
[52] U.S. Cl. .................................. 438/278; 438/12; 438/4
[58] Field of Search .......................... 437/52, 48, 8; 365/189.01–189.07; 364/965.5

[56] References Cited

U.S. PATENT DOCUMENTS

| | | | |
|---|---|---|---|
| 5,045,489 | 9/1991 | Gill et al. | 437/48 |
| 5,063,170 | 11/1991 | Okuyama | 437/48 |
| 5,200,355 | 4/1993 | Choi et al. | 437/52 |

*Primary Examiner*—Jey Tsai
*Attorney, Agent, or Firm*—Cushman Darby & Cushman, IP Group of Pillsbury Madison & Sutro, LLP

[57] ABSTRACT

The ROM device comprises a number of memory cells each is constructed based on a MOS transistor, the memory cells in the ROM are arranged into a number of rows and a columns. A number of word lines each connects to the gates of each of the MOS transistors of all the memory cells in each of the rows. A number of bit lines each connects to one of the source/drain pair of each of the MOS transistors of all the memory cells in each of the columns. A multiplexer comprises a number of transmitting transistors, each of the transmitting transistors is connected to a corresponding one of the bit lines, forming a current flow path including the transmitting transistor, the connected bit line, and the memory cells correspondingly connected to the bit line. A sense amplifier is coupled to the multiplexer for sensing the current flowing therethrough the current flow path to output a corresponding sense output signal. The method for bypassing null-code sections to comprise programing the transmitting transistor in the current flow path into an off status when all memory cells in the column connecting to the bit line of the transmitting transistor is required to contain null code.

15 Claims, 8 Drawing Sheets

METHOD FOR BYPASSING NULL-CODE SECTIONS FOR READ-ONLY MEMORY BY ACCESS LINE CONTROL

BACKGROUND OF THE INVENTION

1. Field of the Invention

The present invention relates in general to a method for bypassing null-code sections in read-only memories (ROM). In particular, the present invention provides a method for bypassing unused storage sections in ROM devices by cutting off the entire access current flow path in the access lines of the ROM device. More particularly, the present invention relates to a method for bypassing the null storage sections while providing correct access results in case these unused null codes are accessed in the device quality control testing, even if defects exist in these null code sections of the ROM device.

2. Description of Related Art

Read-only memory (ROM) is a type of semiconductor storage device that is widely used in various applications. ROM integrated circuits (IC's) are different from other categories of re-writable semiconductor memories, for example, static random access memories (SRAM), dynamic random access memories (DRAM), as well as electronically erasable-programmable read-only memories (E²ROM). As their name implies, ROM's are read only, data contained in a ROM IC, either program code or data as provided by a customer of the ROM IC, is normally programmed into the ROM device in a factory. Information contained in the ROM IC can only be read, no new data can be written into the device once after the ROM IC is programmed during its manufacture.

The data to be programmed into the memory array of a ROM IC device, either program code or information, as is well known in the art, is normally converted into a set of binary code represented by a string of 0's and 1's, i.e., bits. These bits are to be stored permanently in the array of memory cells of the ROM IC device. The memory cells in the array are identified and accessible, that is, readable, via an addressing system. For example, in an industry standard one mega-bit ROM device organized as 128K address locations of 8-bit bytes, each of the data bytes comprising either the 0's or 1's to be stored is assigned into the corresponding 8-bit memory locations addressed by the addressing system of the ROM device.

The fabrication process stages for all ROM devices, whether or not they contain the same contents, are the same before the procedure of code programming is performed. In fact, even the code programming phase of fabrication can be considered to be the same for all ROM devices. The only difference being the code contents reflected by different programming masks.

The storage capacity of ROM IC devices is expanding with each generation of device. The capacity expansion is typically doubled once the fabrication technology allows the device to be made with finer resolution. The doubling of the storage capacity is reflecting the fact that expansion of the storage capacity requires the addition of the memory address bits. A minimum increase of one address bit to the device doubles the addressing range of the device. Thus, commercial ROM IC's are available in storage capacities such as 256K, 512K, 1M, 2M, 4M, 8M and 16M bits etc. Capacities smaller than 256K were and still are available, and capacities larger than 16M bits are doubtlessly going to be commercially available as semiconductor technology advances.

With the advent of the these large capacity ROM IC devices, it is frequently the case that nearly one half of the storage capacity is useless for a code storage application. For example, if a program has a code size slightly larger than 1M bits that can not be fitted into a 1M device, then nearly one million bits of storage space in the 2M device will be wasted. Further, typical program codes and data frequently include scattered sections in the entire ROM memory array that contain continuous 0's or 1's. When expressed in ROM IC content listing, consecutive 0's such as 00h for 8-bit devices and 0000h for 16-bit devices observed. On other occasions, these null contents are listed as FFh or FFFFh respectively. The letter "h" indicates that the numbers are in hexadecimal format. In the context of the present invention, these sections of null ROM code will be the sections of storage contents to be "bypassed".

FIG. 1 schematically shows the layout of a block diagram of a conventional semiconductor ROM IC device. In this typical ROM device, memory cells, herein designated as MC, each constructed around a MOS transistor, are arranged in an array of rows and columns. Typically, all the memory bits in the memory word accessed by the same address assignment are assigned into the columns in the memory array, and all the accessible address locations are assigned into the rows. For example, in the 1M device organized as 128K positions of 8-bit bytes, there is a memory array organized as 128K rows by eight columns.

Memory cells MC in the same row have the gates of their respective MOS transistors connected in common to a horizontal word line WL. The input to each word line WL is fed by a row decoder 10, which serves to decode the row address based on the input address to the ROM device. In a similar manner, memory cells MC in the same column have the drains of their respective MOS transistor connected in common to a vertical bit line BL. Each of the bit lines BL is multiplexed via a multiplexer 12 to the input of a sense amplifier 14. A typical column decoder 16 includes and controls a multiplexer 12 consisting of a number of MOS transmitting transistors denoted MY.

When the conventional ROM device of FIG. 1 is accessed by external logic, an address comprising of a number of address bits is input to the row and column decoders 10 and 16 respectively for decoding. Based on the result of the decoding, a corresponding word line WL is enabled by the row decoder 10 to be the selected word line. Likewise, several corresponding bit lines BL will also be enabled by the column decoder 16 and multiplexed by multiplexer 12 into the sense amplifier 14 to be the selected bit lines. The number of the selected bit lines is determined by the number of I/O pins of the ROM IC device in question. The typical number of I/O pins found in commercial ROM IC's is eight, sometimes sixteen, corresponding to the byte- or word-accessed devices respectively. The intersections of the selected word line and the selected bit lines are the memory locations that correspond to the addressed memory location intended by the issued address.

Reference numeral 3 found in FIG. 1 generally shows the flow path of the current flowing through the circuit path comprising the selected memory cell MC, the transmitting transistor MY of the multiplexer 12, and the sense amplifier 14. This current flow path is also depicted in FIG. 2.

If a memory cell accessed in the process described above contains a null bit of information, that is, the bit is not programmed and the channel of the MOS transistor constituting the memory cell is not implanted during the programming phase of the ROM device fabrication, then the particular memory cell MC would remain to be a conducting component in the flow path diagram of FIG. 2. Such non-programmed memory cell will be referred to as an ON cell in the memory array of the ROM device. On the other hand, if the accessed memory cell is indeed programmed by implantation in the photo-masked programming phase, then the MOS transistor of the memory cell MC in the flow path diagram of FIG. 2 would be turned off. The MOS transistor in the memory cell MC would normally acquire a threshold voltage higher than the normal word line voltage can achieve. This allows a minor leakage current when the transistor remains in its off state. Similarly, such a memory cell having a turned-off transistor will be referred to as an OFF cell.

Sense amplifier 14 distinguishes between the ON and OFF cells as multiplexed thereto. The principle is to sense and distinguish between the scale of the current that flows in the path diagram of FIG. 2. With a ON cell, the current is detectably large while in the case of an OFF cell, the leakage current is too small to be detected by the sense amplifier 14. The output of the sense amplifier 14 is a voltage SAOUT that represents the sense result as either ON or OFF.

In a typical ROM device implementation, the sense amplifier 14 outputs an SAOUT voltage that is converted by the output stage 18 into a logical low voltage "0" when an ON cell is sensed. On the other hand, a logical high voltage "1" will be issued when an OFF cell is sensed. The output stage 18 of the sense amplifier 14 may comprise, for example, an OP buffer. However, depending on the implementation of the electrical system in the ROM IC device, logical voltages high and low may be generated to reflect the sense of the ON and OFF cell respectively.

FIG. 3 schematically shows a block diagram layout of the conventional flat-type ROM IC device. The flat-type ROM differs from the ROM device of FIG. 1 in that its rows of memory cells are arranged into banks. A defined number of rows of memory cells in the memory array are grouped together to form "banks". For the row decoder of the flat-type ROM device, in addition to the individual word lines WL connecting the gates of each transistor of the memory cells in a row, bank-selecting word lines BWL are also required to be enabled when the device is accessed.

Refer now to FIG. 4. For the column decoder, $2^n$ (for example, 16, or 32, or more) memory cells MC in the same column are organized in a group and have the drains of their MOS transistors tied together to form a diffusion line. There is a similar arrangement for the sources of the respective MOS transistors in the same organized group of $2^n$ memory cells MC in a column. The diffusion line formed by the connection of each of the drains in a group is also the source-connected diffusion line for the next consecutive group of memory cells. This can be observed in FIG. 4. A cascade of memory cell banks, in which each bank comprising the $2^n$ rows, are thus formed to construct the entire memory array for the ROM device. FIG. 4 of the drawing shows the generally equivalent circuit of the memory array of the flat-type ROM IC of FIG. 3.

One end of each of the diffusion lines is connected to a bit line by a bank-selecting transistor BT, as shown in FIG. 4. Each of the diffusion lines that connects the drains or sources of the MOS transistors of the memory cells grouped together as a bank is referred to herein as local bit line LBL. There are thus a total of $2^n$ memory cells gathered in every local bit line LBL. The entire bit line that connects the bank-selecting transistors BT in a column is referred to herein as the global bit line GBL. The bank-selecting transistor BT has a similar structural configuration as that of the memory cell MC. The gates of the bank-selecting transistors in the same row are also tied together as is the case of the word lines to form a bank-selecting word line BWL. Based on the design of the ROM device, there may be more than one bank-selecting transistor BT utilized to connect the local bit line LBL to the global bit line GBL.

With reference to FIGS. 3 and 4, when a ROM read access is intended, the row decoder 10 issues not only to enable the one or several word lines WL, there is one or several bank-selecting word lines BWL also enabled. Similarly, through the multiplexing of the multiplexer 12, one or several global bit lines GBL may be enabled as well by the column decoder 16. The selected global bit line GBL, which is the data bit line, has its one end connected to the input of the sense amplifier 14, and is connected to the local bit line LBL at its other end via the multiplexer 12 and the enabled bank-selecting transistor BT. The connection is then relayed via the memory cell MC that is enabled at the gate of its MOS transistor by the selected word line WL.

To constitute a complete electrical signal path for the reading of the memory content in the memory cell MC at the intersection of the selected word line and global bit line GBL, a return path must be provided. This is done by relaying the path through the local bit line LBL connected to the other of the source/drain pair of the MOS transistor of the memory cell MC, via the global bit line GBL connected thereto and back to the multiplexer 12 for connection to the system ground Vss for the completion of the path. This complete path is identified by the dashed line 3 in FIG. 4, and is further depicted in the flow path diagram of FIG. 5. Notice is made to the fact that both the two conventional ROM IC device constructions as outlined in FIGS. 1 and 3 require the use of a multiplexing means to fulfill the memory content reading operation of the ROM IC device. In the case of the flat-type ROM device of FIG. 3, the additional use of bank-selecting transistor is further required.

As is well known in the art, the fabrication of semiconductor devices normally involves a procedure including tens of complicated process steps. Any defect in any one of these steps almost inevitably leads to the result of a useless device. In the case of the ROM IC semiconductor devices, if the defects fall in the range of the bypassed sections, namely those memory locations that will never be accessed in the customer's particular application, then the device may still be considered useful. However, the standard testing procedure in most fabrications will still reject these devices as unacceptable, since all memory locations are thoroughly tested before the device can be qualified to ship. This practice leads directly to the reduction of the yield and the increase of cost.

Conventional techniques for the repair of such defective devices involve the use of extra-prepared, programmable memory cells based on the techniques such as PROM. This scheme of salvaging the otherwise would-be-wasted devices involves the sacrifices in device size, process complexity, testing overhead, as well as costs.

SUMMARY OF THE INVENTION

In one aspect, the present invention provides a method for bypassing null-code sections in ROM's by the cutting off of the entire access current flow path in the access lines of the ROM device.

In another aspect, the present invention provides a method for bypassing address lines of ROM's that allows for the existence of defects in the null storage sections of the ROM devices.

The present invention provides a method for bypassing null-code sections in semiconductor ROMs. The ROM comprises a number of memory cells, each constructed based on a MOS transistor, the memory cells in the ROM are arranged into a number of rows and a columns. A number of word lines each connects to the gates of each of the MOS transistors of all the memory cells in each of the rows. A number of bit lines each connects to one of the source/drain pair of each of the MOS transistors of all the memory cells in each of the columns. A multiplexer comprises a number of transmitting transistors, each of the transmitting transistors is connected to a corresponding one of the bit lines, forming a current flow path including the transmitting transistor, the connected bit line, and the memory cells correspondingly connected to the bit line. A sense amplifier is coupled to the multiplexer for sensing the current flowing therethrough the current flow path to output a corresponding sense output signal. The method for bypassing null-code sections includes the step of programming the transmitting transistor in the current flow path into an off status when all memory cells in the column connecting to the bit line of the transmitting transistor is required to contain null code.

BRIEF DESCRIPTION OF THE DRAWING

Other objects, features and advantages of the present invention will become apparent by way of the following detailed description of the preferred but non-limiting embodiment. The description is made with reference to the accompanied drawings, wherein.

DETAILED DESCRIPTION OF THE PRESENTLY PREFERRED EMBODIMENT

Storage contents of ROM IC's may include bypassed sections having un-programmed memory locations. The scattering of the bypassed sections may vary between applications. Small sections of continuous binary 0 or 1 null code may be distributed in the entire storage range of a ROM IC. This is frequently seen in the normal storage capacity ROM devices. On the other hand, in high capacity devices, it is frequently the case that a large ending null code may just fill the un-used storage space of a ROM IC. With suitable arrangement, these by-passing sections that scatter a ROM IC may be located in physically continuous sections in the ROM IC device. In other words, these bypassing sections may be arranged as continuous ON or OFF memory cells in the memory array of the ROM IC device.

In the case of high capacity ROM IC devices, for example, in applications where a device capable of holding 16M bits is used, the bypassing sections may be arranged to align along the word lines, or along the bit lines, depending on whichever has the fewer address bits. On the other hand, in the case of smaller ROM IC devices, since the bypassing sections they may hold may be smaller sections, they can be arranged to align along the bit lines. Particularly in the situation of flat-type ROM devices, it is relatively easy to form uniform 0's or 1's in a section of memory cells corresponding to a particular bit line within a bank of rows.

Figure 1:
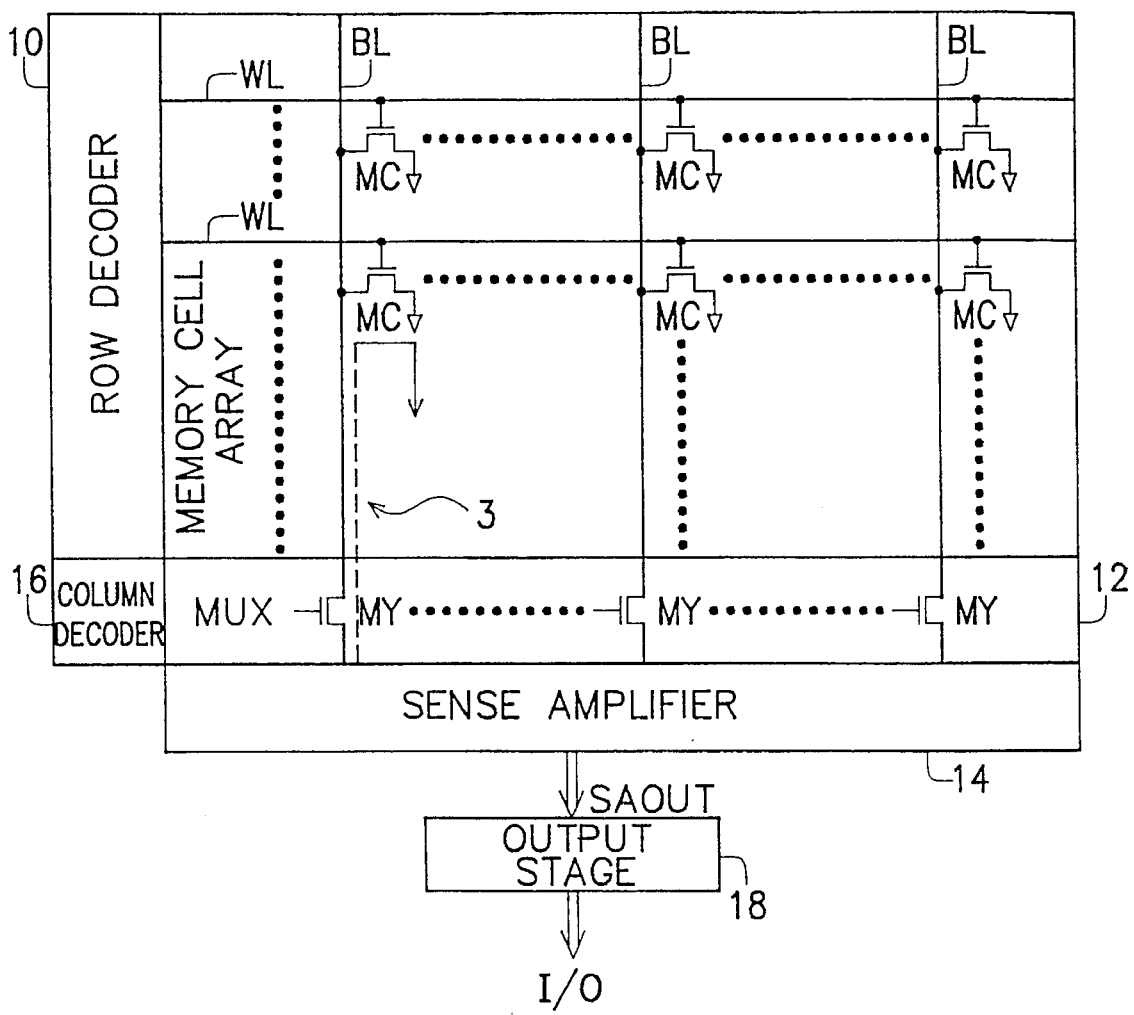
FIG. 1 schematically shows the layout of the block diagram of a conventional semiconductor ROM IC device.
Figure 2:
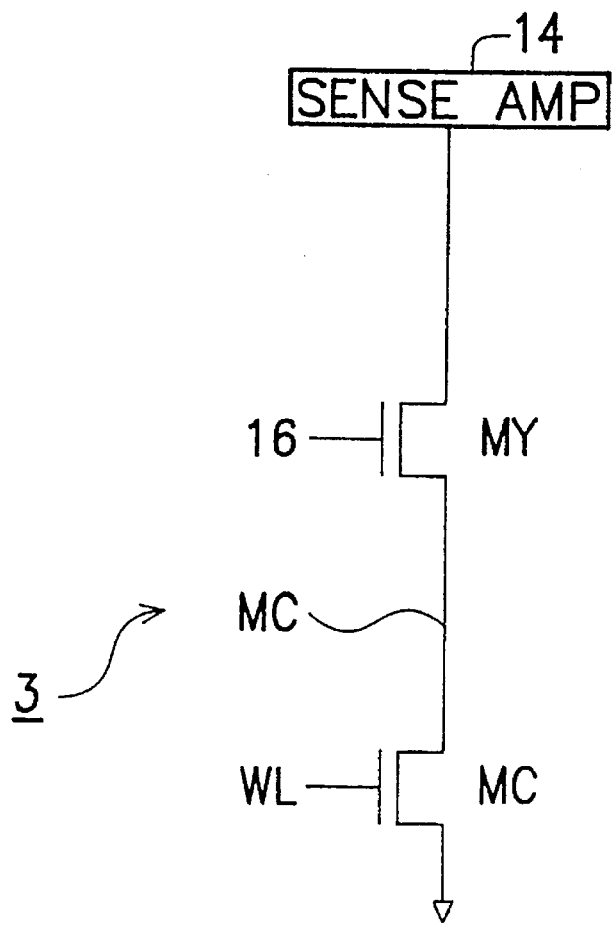
FIG. 2 schematically shows the flow path of the current flowing through the ROM IC device of FIG. 1.
Figure 6:
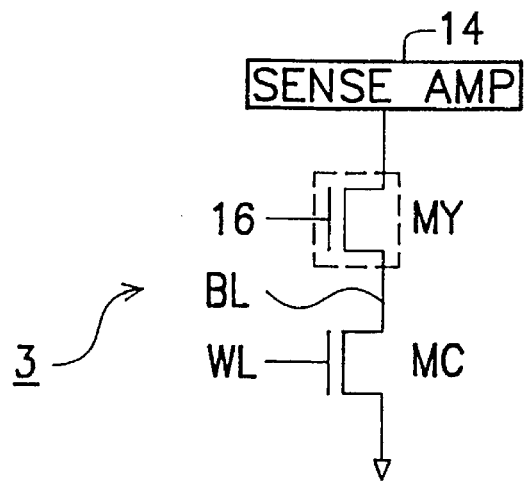
FIG. 6 schematically shows the flow path of the current flowing through the ROM IC device of FIG. 1 employing the method of bypassing address lines in accordance with a preferred embodiment of the present invention.
Figure 7:
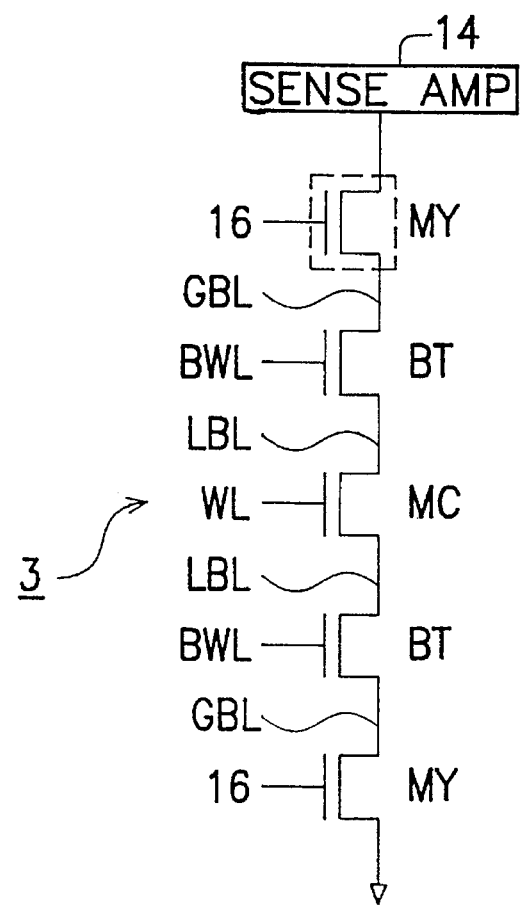
FIG. 7 schematically shows the flow path of the current flowing through the ROM IC device of FIG. 4 employing the method of bypassing address lines in accordance with the preferred embodiment of the present invention.

FIG. 6 schematically shows the flow path of the current flowing through the ROM IC device of FIG. 1, with the application of the method of bypassing address lines in accordance with the present invention. On the other hand, FIG. 7 schematically shows the flow path of the current flowing through the ROM IC device of FIG. 4 with the application of the method of bypassing address lines in accordance with the present invention. With a comparison of FIGS. 6 and 7 to FIGS. 2 and 5 respectively, it can be seen that the general current flow path for reading normally programmed memory cells in the ROM IC devices are the same. However, as is seen in FIGS. 6 and 7, the transmitting transistor MY in the multiplexer 12, as is identified by a broken line box, is programmed along with other memory cells that require programming in the code programming phase of the ROM device fabrication. In other words, the channel of the transmitting transistor MY is implanted in the device programming phase of fabrication and allow the transistor MY itself to become an OFF transistor.

In the case of the conventional ROM device such as the one shown in FIG. 1, since it is the transmitting transistor MY that is OFF, blocking the sensing of all the other memory cell transistors in the column that are connected to this particular transmitting transistor, any attempted reading access to the memory cells in the very column will result in the reading result of a data represented by an OFF cell. In other words, the accessed result can be "interpreted" by the sense amplifier 14 as is an OFF cell.

Thus, if the code content to be programmed into the ROM IC can be arranged so that a particular main bit line connects to an entire column of memory cells that require to be programmed as OFF cells, then the programming to the transmitting transistor MY can be a practical means to "program" an entire column of the same null data bits, which are represented by the single OFF status of the transmitting transistor MY. In this case, the presence of defective memory cells in this particular column would not prohibit the qualification of the entire ROM device in the quality control testing phase of device fabrication. This is because, as mentioned above, that the transmitting transistor MY would always give an OFF result to any read attempt to any memory cell in the column, whether or not any memory cell in the column would actually be in the defective, the wrong ON status. Further, as was discussed above, the presence of such defective memory cells, if any, would not affect the correct reading of any of the memory cell content of the entire ROM device, because those defective memory cells are in the null column that would never be accessed by the application program that makes use of the ROM device.

The inclusion of the programming to the transmitting transistor MY, simultaneously along with all other memory cell transistors in the device programming phase of fabrication, would not incur any cost increase to the ROM device manufactured. The programming of the transmitting transistor MY can also be implemented on the photo mask that is used for the programming for all the memory cells in the array.

Figure 3:
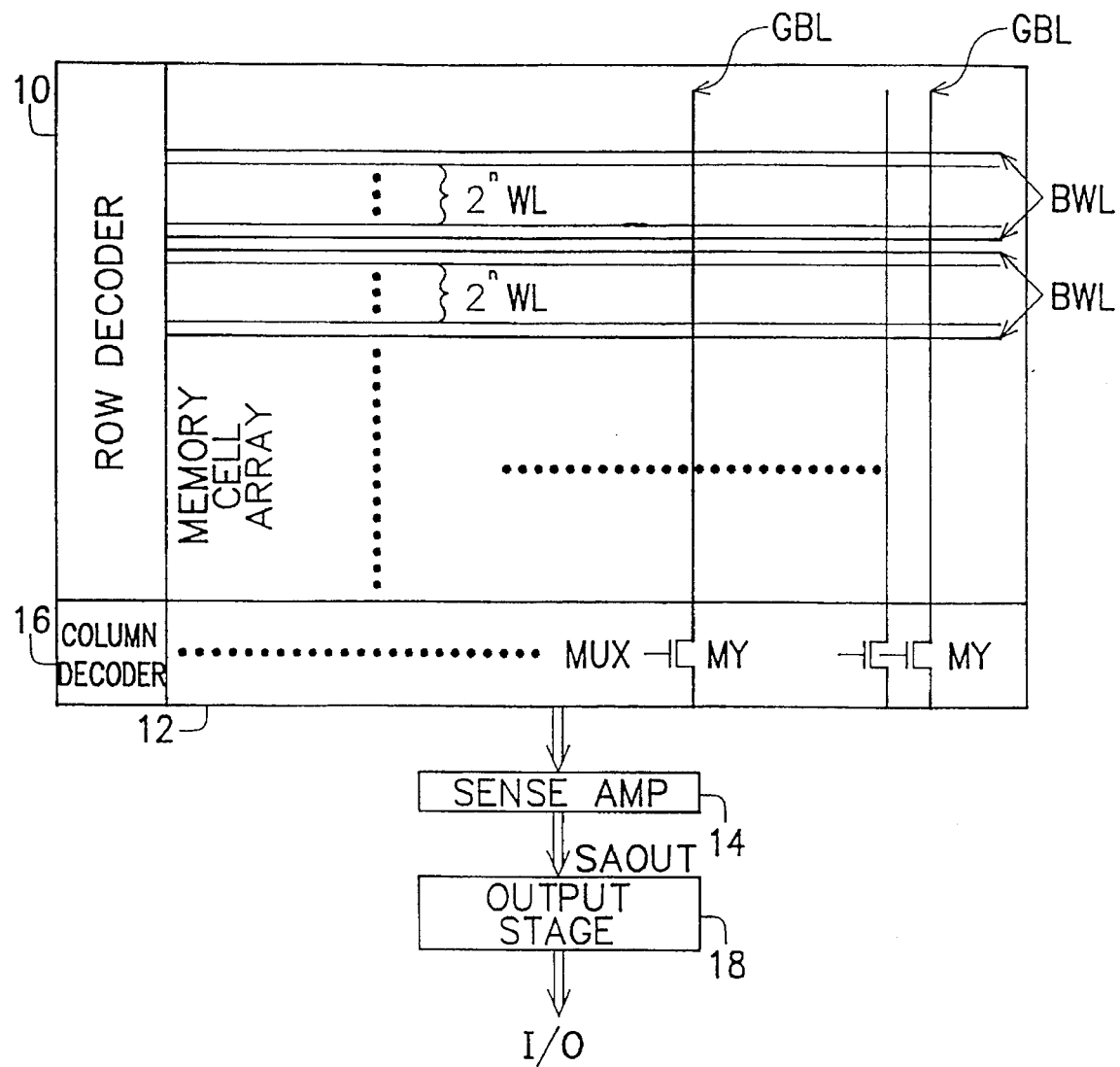
FIG. 3 schematically shows the layout of the block diagram of the flat-type ROM IC device.

Based on the implementation of different ROM designs, such as the flat-type ROM device shown in FIG. 3, one transmitting transistor MY in the multiplexer 12 may correspond to more than one column of memory cells, that is, it may be connected to more than one main bit line. In this case, only one transmitting transistor MY would be required to be programmed in order to effect the null-programming, namely, the bypassing of the entire columns of memory cells. This is clearly seen in the flow path diagram of FIG. 7, wherein only one of the two transmitting transistors 16 is required to be programmed into OFF state. The cutting off of the one of the two transmitting transistors 16 would effectively result in the null-reading of the entire column connected.

Figure 4:
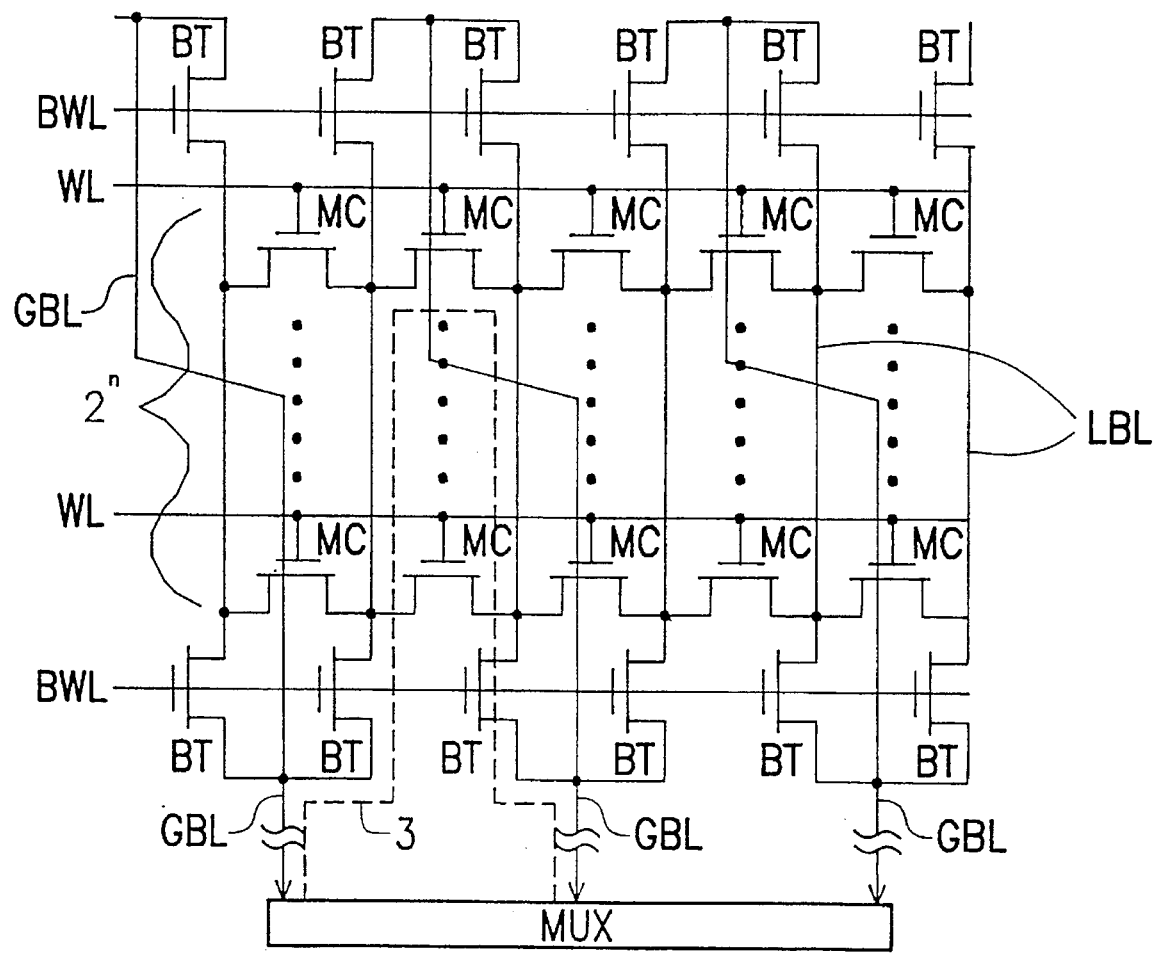
FIG. 4 shows the generally equivalent circuit of the memory array, together with the row and column decoders, of the flat-type ROM IC of FIG. 3.
Figure 5:
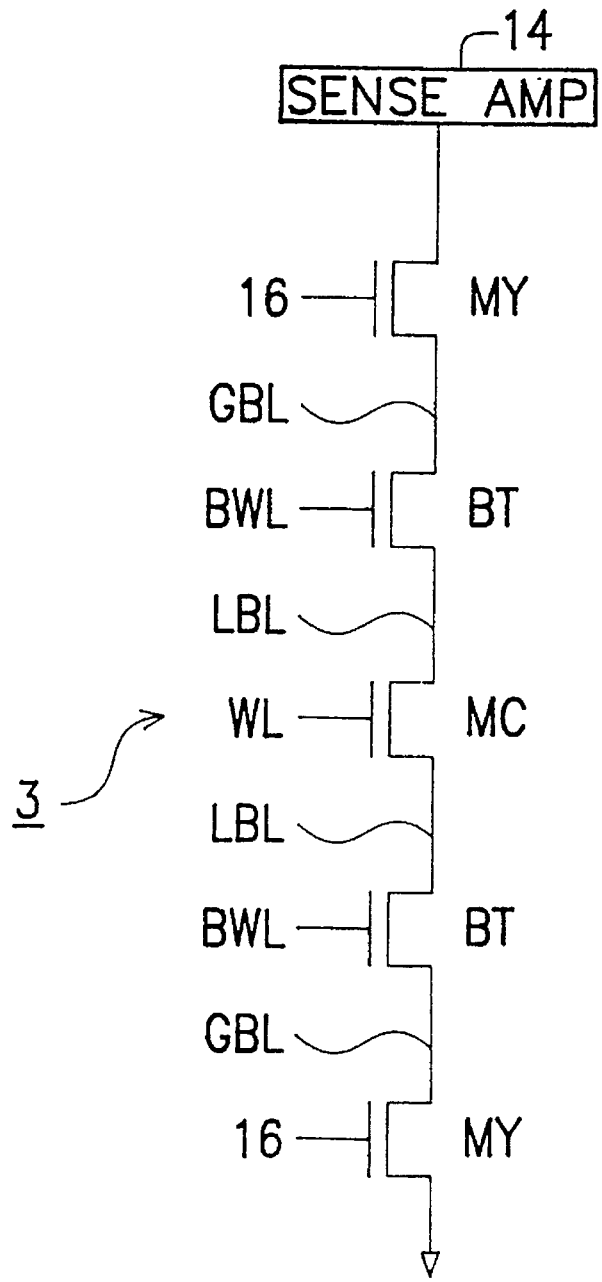
FIG. 5 schematically shows the flow path of the current flowing through the ROM IC device of FIG. 4.
Figure 8:
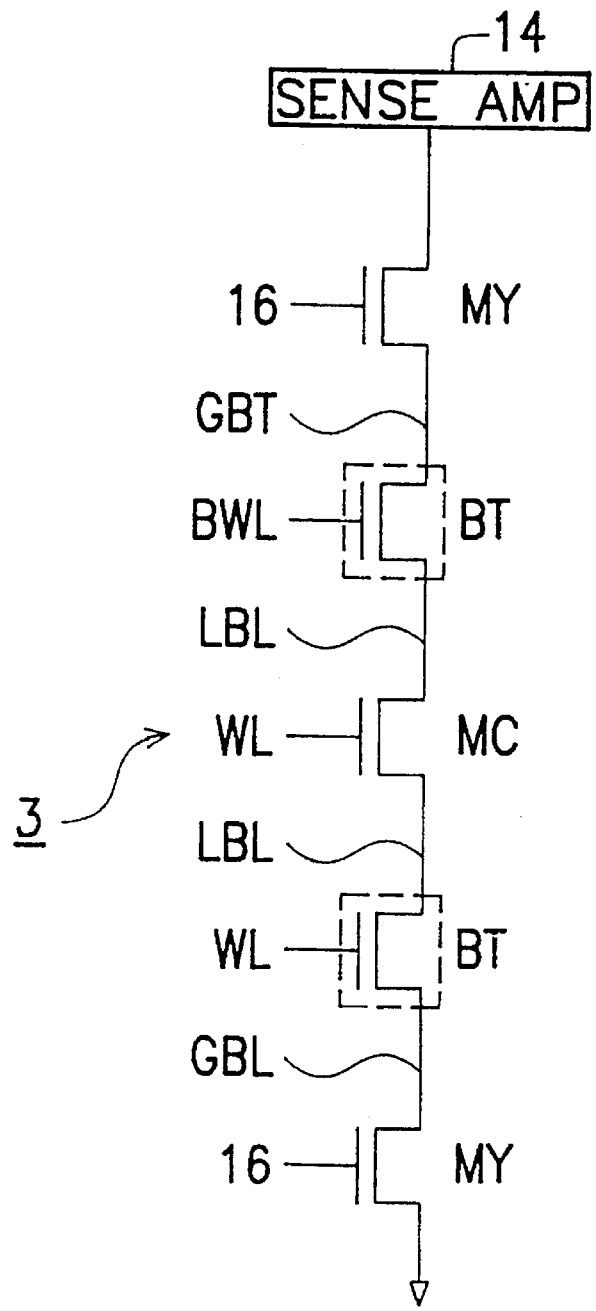
FIG. 8 schematically shows the flow path of the current flowing through the ROM IC device of FIG. 4 employing the method of bypassing address lines in accordance with another preferred embodiment of the present invention.

FIG. 8 schematically shows the flow path of the current flowing through the ROM IC device of FIG. 4 employing the a method of alternatively bypassing address lines in accordance with the present invention. In the flow path diagram of FIG. 8, it can be seen that, instead of the transmitting transistor MY in the case of FIG. 7, it is the bank-selecting MOS transistors BT on the bank-selecting word line BWL that are programmed. This allows the nullifying of the bank portions of the memory cells. The cutting off of the bank-selecting transistor BT allows the nullifying of the smaller bypassing sections that may scatter around a smaller ROM IC device in their typical applications.

A typical section that requires bypassing in these instances would have the $2^n$ memory cells on a local bit line LBL to be nullified, while for the conventional ROM IC's with a value of n not greater than 5, there will be a small section not greater than $2^n=32$ memory cells nullified, which is properly suitable for bypassing small sections in the typical applications.

The programming of the bank-selecting transistor BT is the same as that for the transmitting transistor MY described above. That is, they are also programmed in the photo-masked programming phase of the device fabrication, and enjoy the same advantages described above.

Figure 9:
FIG. 9 schematically shows the block diagram of the bypassed data inverter in accordance with the preferred embodiment of the present invention.

The main and local bit-line bypassing methods described above are suitable for the bypassing sections of storage content in the ROM device that can result in the reading of data represented by the OFF status of the memory cells. If, on the other hand, the bypassing in the ROM device requires the data storage to be based on the ON status of the memory cells, they will not be applicable. In this case, a bypassed data inverter 20 can be inserted between the output of the sense amplifier 14 and the input to the output stage 18, as is shown in FIG. 9, wherein the block diagram of a bypassed data inverter in accordance with the preferred embodiment of the present invention is shown.

Figure 10:
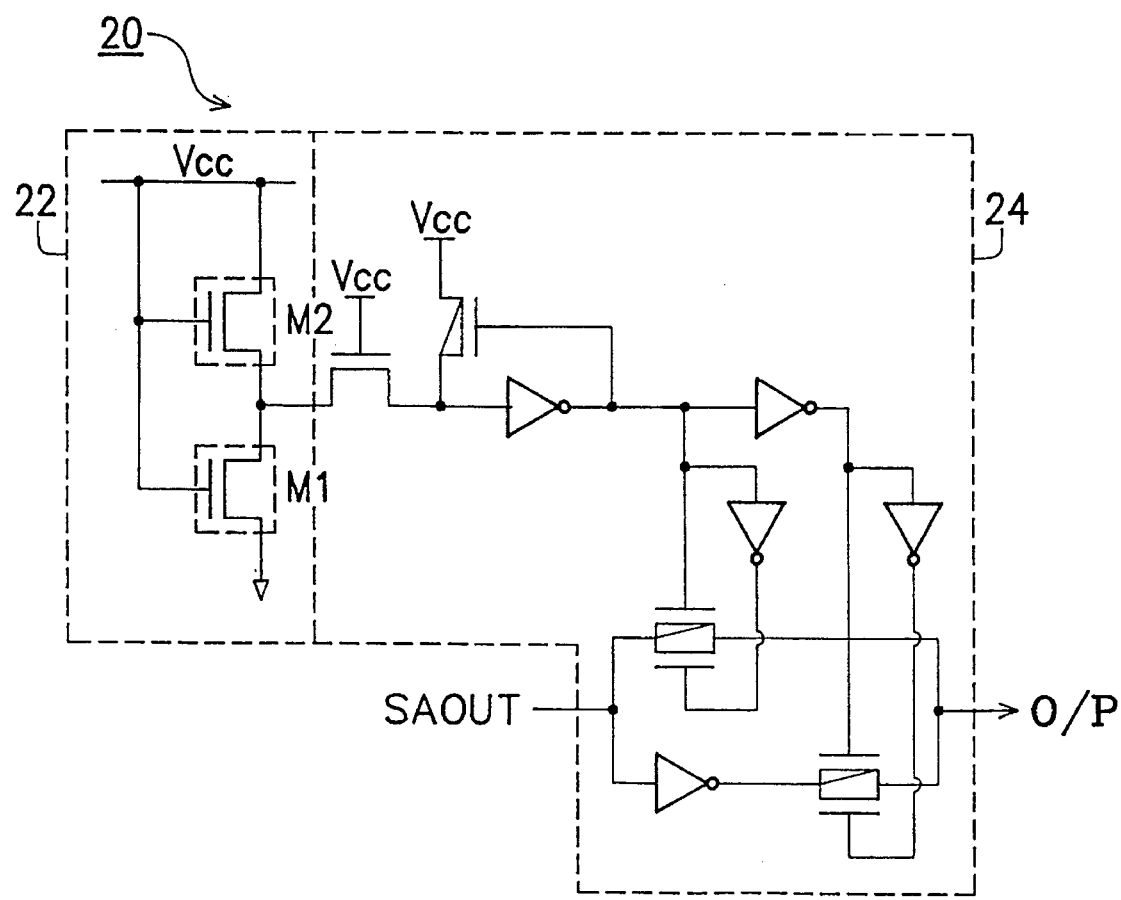
FIG. 10 shows the schematic diagram of an embodiment of the bypassed data inverter of FIG. 9.

The function of the bypassed data inverter 20 is to selectively invert the null data as sent out by the sense amplifier 14, so that the null data as accessed may appear as the desired logic 0 or 1 format. FIG. 10 shows the schematic diagram of an embodiment of the bypassed data inverter 20 of FIG. 9. The controlled inverter 20 comprises a mode selection circuit 22 and an inversion circuit 24. The mode selection circuit 22 includes two mode selecting transistors M1 and M2. Either one of them can be programmed along with other memory cells, as well as the bypassing control transistors such as transmitting transistor MY of multiplexer 12 and the bank-selecting transistors BT described above, in order to select to decide whether or not to allow the inversion circuit 24 to invert the output SAOUT of the sense amplifier 14. Thus, the desired version of the output stage 18 can be provided for the logics that demanded the access of the ROM device, with correct result.

Thus, as persons skilled in this art can appreciate, the method of the present invention as disclosed in the above paragraphs of description can be implemented all within the context of the conventional technique of semiconductor ROM IC device fabrication. The inclusion of the programming to the mode selecting transistors M1 and M2, the bank-selecting MOS transistors BT, as well as the transmitting transistors MY, are all implemented along with the normal procedure of ROM code programming during the photo-masking process steps. No extra costs need to be involved for the method of the present invention. Nor is there any complexity added due to the introduction of the method of the present invention. The advantages introduced by the implementation of the method of the present invention, obviously, is the allowance of the presence of defects in the null code sections. Due to the fact that these null code sections would never be accessed during the intended normal utilization of the ROM devices fabricated in accordance with the teachings of the present invention, there is no influence on the usefulness of the ROM devices fabricated based on the method of the present invention.

We claim:

1. A method for bypassing null-code sections in semiconductor read-only memory, the read-only memory having:

a plurality of memory cells each comprising a MOS transistor, the memory cells being arranged in a plurality of rows and a plurality of columns;

a plurality of word lines each connecting the gates of each of the MOS transistors of all the memory cells in each of the rows;

a plurality of bit lines each connecting one of the source/drain pair of each of the MOS transistors of all the memory cells in each of the columns;

a multiplexer means comprising a plurality of transmitting transistors, each of the transmitting transistors being connected to a corresponding one of the bit lines, forming a current flow path including the transmitting transistor, the connected bit line, and the memory cells correspondingly connected to the bit line; and a sense amplifier means coupled to the multiplexer for sensing the current flowing therethrough the current flow path to output a corresponding sense output signal;

the method comprising:

programming the transmitting transistor in the current flow path into an off status when all memory cells in the column connecting to the bit line of the transmitting transistor is required to contain null code.

2. The method of claim 1, wherein the programming step comprises the step of programming the transmitting transistor into the off status simultaneously with all of the memory cells during a programming phase of fabrication of the read-only memory.

3. The method of claim 2, wherein the programming step comprises the step of photo-masked programming.

4. The method of claim 2, further comprising the step of selectively inverting the output of the sense amplifier means.

5. The method of claim 3, further comprising the step of selectively inverting the output of the sense amplifier means.

6. A method for bypassing null-code sections in semiconductor read-only memory, the read-only memory having:

a plurality of memory cells each comprising a MOS transistor, the memory cells being arranged in a plurality of rows and a plurality of columns, and a selected number of the rows of memory cells being further grouped into banks of memory-cell rows;

a plurality of bank-selecting transistors each connecting to a corresponding bank of memory cells;

a plurality of bank-selecting word lines each connecting the gates of each of the MOS transistors of all the memory cells in each of the banks;

a plurality of word lines each connecting the gates of each of the MOS transistors of all the memory cells in each of the rows;

a plurality of local bit lines each connecting one of the source/drain pair of each of the MOS transistors of all the memory cells in each of the banks;

a plurality of main bit lines each connecting a corresponding one of the bank-selecting transistors to a corresponding one of the local bit lines;

a multiplexer means comprising a plurality of transmitting transistors, each of the transmitting transistors being connected to a corresponding one of the main bit lines, forming a current flow path including the transmitting transistor, the connected main bit line, and the bank of memory cells correspondingly connected to the main bit line; and a sense amplifier means coupled to the multiplexer for sensing the current flowing therethrough the current flow path to output a corresponding sense output signal;

the method comprising programming one of the bank-selecting transistors in the current flow path into an off status when all memory cells in the column connecting to the main bit line of the transmitting transistor is required to contain null code.

7. The method of claim 6, wherein the programming step comprises the step of programming the transmitting transistor into the off status simultaneously with all of the memory cells during a programming phase of fabrication of the read-only memory.

8. The method of claim 7, wherein the programming step comprises the step of photo-masked programming.

9. The method of claim 7, further comprising the step of selectively inverting the output of the sense amplifier means.

10. The method of claim 8, further comprising the step of selectively inverting the output of the sense amplifier means.

11. A method for bypassing null-code sections in semiconductor read-only memory, the read-only memory having:

a plurality of memory cells each comprising a MOS transistor, the memory cells being arranged in a plurality of rows and a plurality of columns, and a selected number of the rows of memory cells being further grouped into banks of memory-cell rows;

a plurality of bank-selecting transistors each connecting to a corresponding bank of memory cells;

a plurality of bank-selecting word lines each connecting the gates of each of the MOS transistors of all the memory cells in each of the banks;

a plurality of word lines each connecting the gates of each of the MOS transistors of all the memory cells in each of the rows;

a plurality of local bit lines each connecting one of the source/drain pair of each of the MOS transistors of all the memory cells in each of the banks;

a plurality of main bit lines each connecting a corresponding one of the bank-selecting transistors to a corresponding one of the local bit lines;

a multiplexer means comprising a plurality of transmitting transistors, each of the transmitting transistors being connected to a corresponding one of the main bit lines, forming a current flow path including the transmitting transistor, the connected main bit line, and the bank of memory cells correspondingly connected to the main bit line; and a sense amplifier means coupled to the multiplexer for sensing the current flowing therethrough the current flow path to output a corresponding sense output signal;

the method comprising:
programming one of the transmitting transistors in the current flow path into an off status when all memory cells in the column connecting to the main bit line of the transmitting transistor is required to contain null code.

12. The method of claim 11, wherein the programming step comprises the step of programming the transmitting transistor into the off status simultaneously with all of the memory cells during the programming phase of the fabrication of the read-only memory.

13. The method of claim 10, wherein the programming step comprises the step of photo-masked programming.

14. The method of claim 12, further comprising the step of selectively inverting the output of the sense amplifier means.

15. The method of claim 14, further comprising the step of selectively inverting the output of the sense amplifier means.

* * * * *